United States Patent
Luckner et al.

(10) Patent No.: US 12,080,573 B2
(45) Date of Patent: Sep. 3, 2024

(54) TEMPERATURE OFFSET AND ZONE CONTROL TUNING

(71) Applicant: Applied Materials, Inc., Santa Clara, CA (US)

(72) Inventors: Ole Luckner, Dresden (DE); Shankar Muthukrishnan, Los Gatos, CA (US); Wolfgang R. Aderhold, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 647 days.

(21) Appl. No.: 16/780,460

(22) Filed: Feb. 3, 2020

(65) Prior Publication Data
US 2020/0251362 A1    Aug. 6, 2020

Related U.S. Application Data

(60) Provisional application No. 62/800,859, filed on Feb. 4, 2019.

(51) Int. Cl.
*H01L 21/67*    (2006.01)
*G05B 15/02*    (2006.01)
(Continued)

(52) U.S. Cl.
CPC ........ *H01L 21/67248* (2013.01); *G05B 15/02* (2013.01); *H01L 21/324* (2013.01); *H01L 21/67103* (2013.01); *H01L 22/26* (2013.01)

(58) Field of Classification Search
CPC ............. F27B 17/0025; H05B 1/0233; H05B 2203/037
See application file for complete search history.

(56) References Cited

U.S. PATENT DOCUMENTS 6,164,816 A * 12/2000 Aderhold .............. G01J 5/0003
374/1
7,398,693 B2    7/2008 Ranish et al.
(Continued)

FOREIGN PATENT DOCUMENTS

EP    1204299 A1    5/2002
KR    10-1530642    6/2015

OTHER PUBLICATIONS

International Search Report and Written Opinion dated May 29, 2020 for Application No. PCT/US2020/016146.
(Continued)

*Primary Examiner* — Michael G Hoang
*Assistant Examiner* — Kurt J Wolford
(74) *Attorney, Agent, or Firm* — Patterson + Sheridan, LLP

(57) ABSTRACT

A method for controlling temperature in a thermal processing chamber includes determining temperature sensitivity profiles of one or more heating elements or zones for a substrate based on measurements of the substrate. The method also includes selecting a temperature offset value for each of the one or more heating elements or zones. The method also includes simulating the adjustment of each of the one or more zone offset values to a respective final adjusting value that achieves a predetermined goal. The method further includes adjusting the temperature offset values for each of the one or more heating elements to the respective final adjusted values.

19 Claims, 5 Drawing Sheets

(51) Int. Cl.
    *H01L 21/324*     (2006.01)
    *H01L 21/66*     (2006.01)

(56) References Cited

U.S. PATENT DOCUMENTS

| | | |
|---|---|---|
| 8,249,436 B2 | 8/2012 | Aderhold et al. |
| 8,724,977 B2 | 5/2014 | Aderhold et al. |
| 9,245,768 B2 | 1/2016 | Aderhold |
| 9,728,471 B2 | 8/2017 | Aderhold et al. |
| 2007/0238202 A1 | 10/2007 | Ranish et al. |
| 2014/0220710 A1 | 8/2014 | Aderhold et al. |
| 2017/0011974 A1 | 1/2017 | Yokawa et al. |
| 2017/0170040 A1* | 6/2017 | Shigetomi ......... H01L 21/67103 |
| 2017/0309529 A1 | 10/2017 | Aderhold et al. |

OTHER PUBLICATIONS

Office Action for Taiwan Application No. 109103294 dated Apr. 17, 2023.
Search Report for Taiwan Application No. 109103294 dated Apr. 11, 2023.

\* cited by examiner

TEMPERATURE OFFSET AND ZONE CONTROL TUNING

CROSS-REFERENCE TO RELATED APPLICATIONS

This application claims priority to U.S. Provisional Patent Application No. 62/800,859, filed Feb. 4, 2019, the entirety of which is herein incorporated by reference.

BACKGROUND

Field

Embodiments of the present disclosure generally relate to a method and apparatus for use in a thermal processing chamber. More specifically, the disclosure relates to adjusting lamp power within a process chamber.

Description of the Related Art

Several processes for the thermal processing of substrates such as semiconductor wafers and other materials involve rapidly heating and cooling a substrate. One example of such processing is rapid thermal processing (RTP), which is used in semiconductor device fabrication.

In rapid thermal processing (RTP), heat energy radiates from radiation sources into the process chamber and to a semiconductor substrate in the processing chamber. In this manner, the substrate is rapidly heated to a processing temperature. During rapid thermal processing, heating elements such as lamps are often used as a radiation source, which heats a semiconductor substrate. The lamps are often arranged radially relative to the center of a lamphead containing the lamps. For example, a plurality of vertically extending lamps having a bulb extending towards the substrate from a lamp base can be arranged along various radii from a center of the lamphead. The lamps are often divided into zones based on location, and the zones are in turn arranged into groups. The lamps in a group are often controlled together to produce a desired temperature in the chamber.

To maintain a uniform temperature, optical pyrometry is used to measure temperature in RTP systems. One or more pyrometers measure emitted radiation intensity from an object and perform an appropriate calculation to obtain a temperature. However, variations between individual temperature sensors and differences in positions of the individual temperature sensors with respect to a particular substrate in the chamber can affect the accuracy of the temperature measurements.

Therefore, there is a need for an improved tuning method to improve temperature and process uniformity in a process chamber.

SUMMARY

The present disclosure generally relates to a method and apparatus for adjusting temperature offset values and lamp zone offset values. More specifically, the disclosure relates to improving process uniformity by simulating different lamp zone offset values for one or more lamp zones to determine processing values. When the simulation returns processing values, the lamp zone offset values are set to the processing values and used during substrate processing.

In one embodiment, a method for controlling temperature in a thermal processing chamber includes determining temperature sensitivity profiles of one or more heating elements for a substrate based on measurements of the substrate. The method also includes selecting a temperature offset value for each of the one or more heating elements. The method also includes adjusting each of the one or more temperature offset values to a respective final adjusting value that achieves a predetermined goal. The method further includes adjusting the temperature offset values for each of the one or more heating elements to the respective final adjusted values.

In another embodiment, a computer system for controlling temperature in a thermal processing chamber comprises a processor, and a memory. The memory stores instructions that, when executed by the processor, cause the computer system to: determine temperature sensitivity profiles of one or more heating elements for a substrate based on measurements of the substrate, select a temperature offset value for each of the one or more heating elements, adjust each of the one or more temperature offset values to a respective final adjusting value that achieves a predetermined goal, and adjust the temperature offset values for each of the one or more heating elements to the respective final adjusted values.

Further embodiments include a non-transitory computer-readable storage medium comprising instructions that cause a computer system to carry out the above method. Other embodiments include a processor and a memory that includes a program executable in the processor to perform operations to carry out the above method.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of scope, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

A method for controlling temperature in a thermal processing chamber is described herein. Process uniformity can be improved by simulating not only temperature offset values but also lamp zone offset values for one or more lamp zones to determine processing values. In embodiments described herein, lamp power can be controlled on a zoneby-zone basis instead of by groups of zones. The simulation returns processing values for the offset values based on a predetermined goal, and then the lamp zone offset values are set to the processing values and used during substrate processing.

Figure 1:
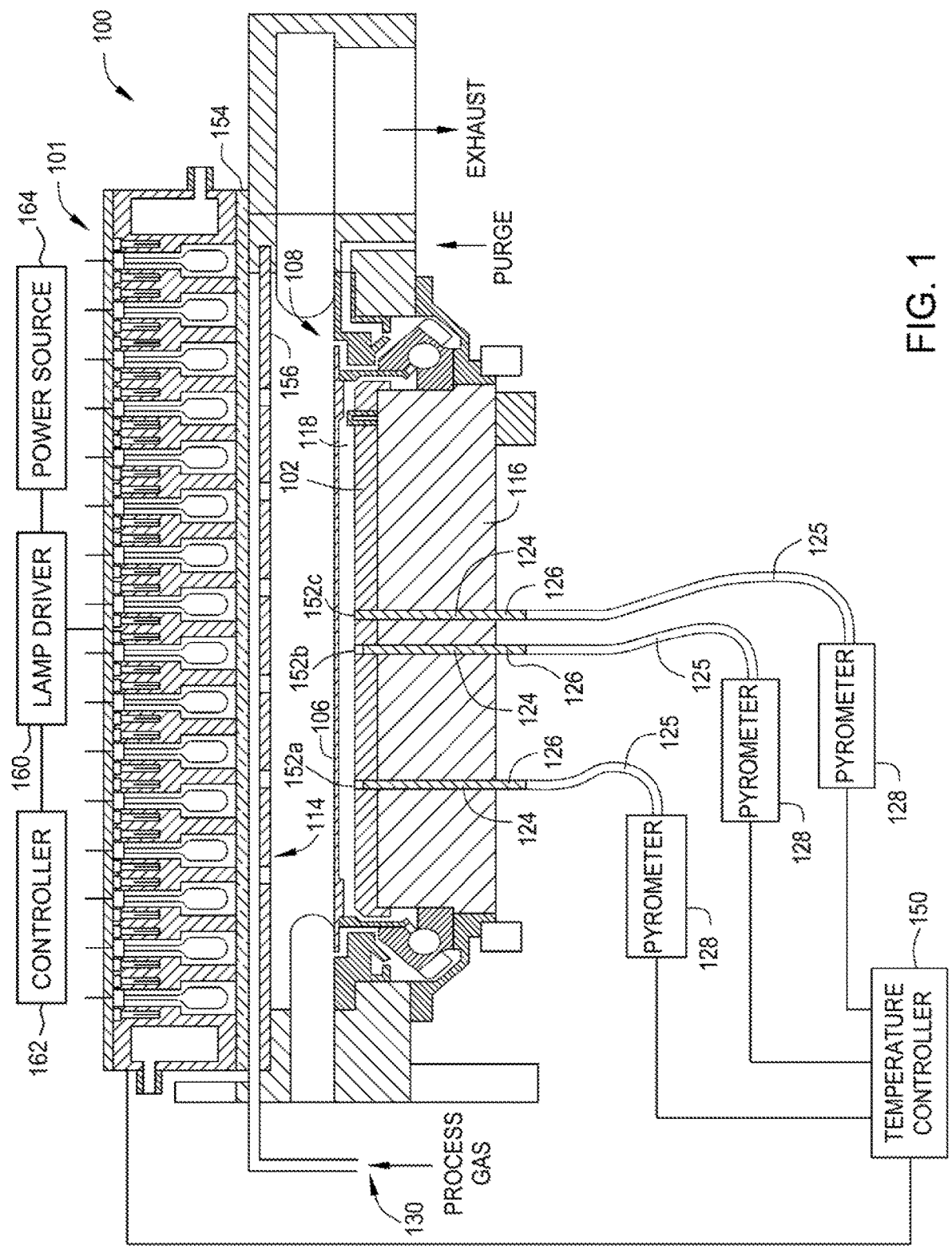
FIG. 1 is a schematic cross-sectional view of an implementation of a thermal processing chamber in accordance with one or more embodiments of the present disclosure.
Figure 2:
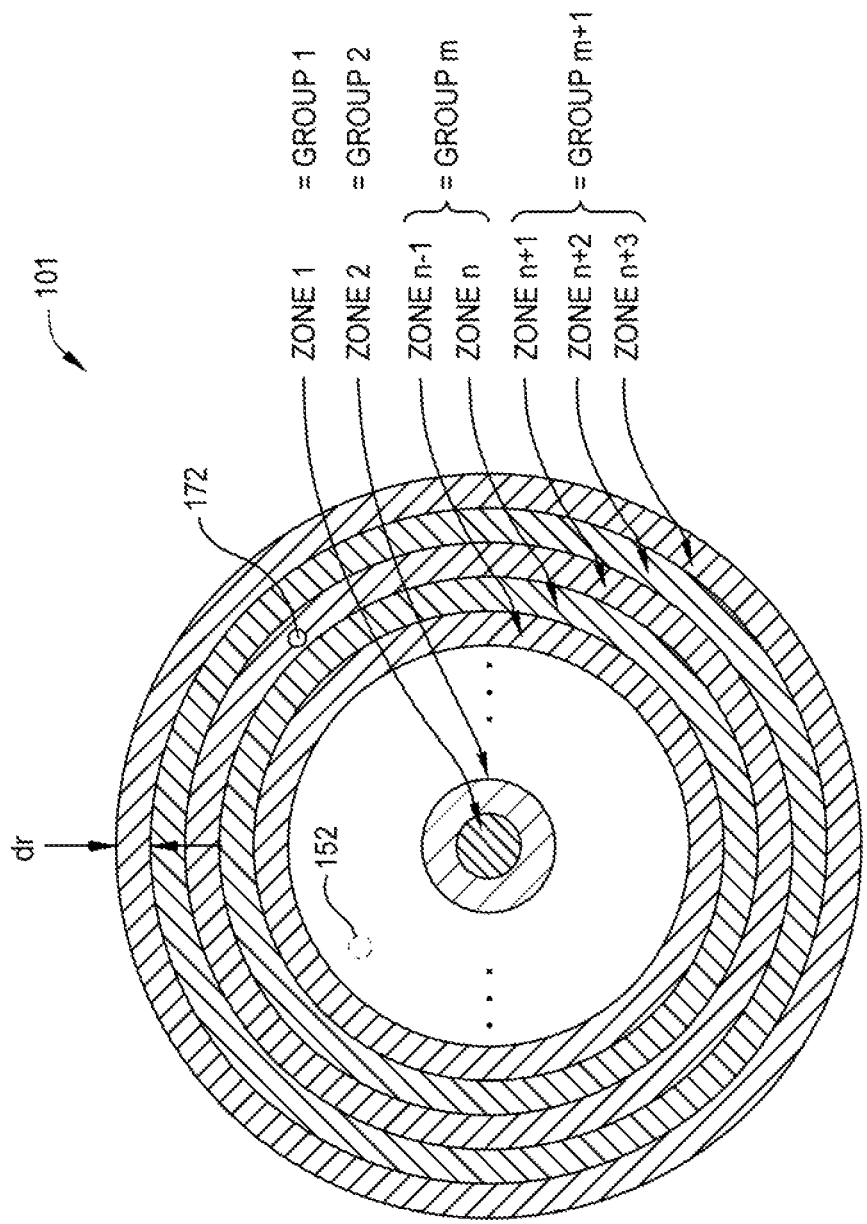
FIG. 2 is a view of a lamphead and associated lamps according to an embodiment.

FIG. 1 depicts a Rapid Thermal Processing system (RTP) in accordance with some implementations of the present disclosure. Exemplary RTP chambers may include the RADIANCE® or RADIANCEPlus chambers available from Applied Materials, Inc. of Santa Clara, Calif.; however, chambers by other manufacturers are also contemplated. The RTP system may include a processing chamber 100 having a lamphead 101 for processing a substrate 106. The lamphead 101 may include an array of lamps as depicted in FIG. 1. The lamps may be distributed as illustrated in FIG. 2 below in an embodiment.

Referring back to FIG. 1, the substrate 106 is mounted inside the processing chamber 100 on a substrate support 108 and is heated by the lamphead 101, which is disposed in a position opposing the substrate support 108. The lamphead 101 generates radiation, which is directed to a front side 107 of the substrate 106. Alternatively (not shown), the lamphead 101 may be configured to heat the backside 109 of the substrate 106, for example, such as by being disposed below the substrate 106, or by directing the radiation to the backside of the substrate 106. The radiation enters the processing chamber 100 through a window assembly 114. A reflector 102, which is mounted on a water-cooled base 116, is positioned beneath the substrate 106.

The temperatures at localized regions of the substrate 106 are measured by a plurality of temperature sensors, such as sensors 152a, 152b, and 152c. Each temperature sensor includes a light pipe 126 that passes through a conduit 124 that extends from the underside or backside of the water-cooled base 116 through the top of the reflector 102. The light pipe 126 may be a sapphire light pipe. In some implementations, the light pipe 126 is about 0.125 inch in diameter and the conduit 124 is slightly larger. The light pipe 126 is positioned within the conduit 124 so that its uppermost end is flush with or slightly below the upper surface of the reflector 102. The other end of light pipe 126 couples to a flexible optical fiber 125 that transmits sampled light from a reflecting cavity 118 to a pyrometer 128. In some exemplary embodiments, the light pipe 126 may be directly connected to the pyrometer 128 without the need for a flexible optical fiber 125.

The pyrometer 128 is connected to a controller 150, which controls the power supplied to the lamphead 101 in response to a measured substrate temperature. In some implementations, such as for a 200 mm substrate, the lamphead 101 may use a plurality of lamps, such as 187 lamps, to deliver highly collimated radiation from tungsten-halogen lamps to the processing chamber 100. In some implementations, such as for a 300 mm substrate, the lamphead 101 may use a plurality of lamps, such as 409 lamps. The number and configuration of the lamps disclosed herein are exemplary and other numbers and configurations of lamps may be used.

The lamps may be grouped into multiple zones, as described in further detail below. The zones can be individually adjusted by the controller to allow controlled radiative heating of different areas of the substrate 106.

As indicated above, the described implementations use measurement or temperature sensors distributed over the reflector 102 to measure the temperature of the substrate 106 at different radii thereof. During the thermal processing, the substrate 106 is rotated, for example, at about 240 rpm. Thus, each temperature sensor may sample the temperature profile of a corresponding annular ring area on the substrate 106, and one temperature sensor may measure the temperature at the center of the substrate 106.

The window assembly 114 is disposed in an upper portion of the processing chamber 100 to allow light energy provided by the lamphead 101 to enter the processing chamber 100. In some implementations, the window assembly 114 includes an upper window 154 and a lower window 156. The upper window 154 and the lower window 156 each comprise a material transparent to the energy provided by the lamphead 101 to allow radiation from the lamphead 101 to enter the processing chamber 100 therethrough. In some implementations, the upper window 154 and the lower window 156 are quartz. However, the upper window 154 and the lower window 156 may be made out of different materials as well. Generally, the upper window 154 and the lower window 156 are configured to allow energy provided by the lamphead 101 to pass therethrough.

The controller 150 receives data from the temperature sensors 152a-c and separately adjusts power delivered to each lamp of the lamphead 101, or individual groups of lamps or lamp zones, based on the data received. The controller 150 may include a power supply that independently powers the various lamps or lamp zones. The controller 150 can be configured with a targeted temperature profile, and based on comparing the data received from the temperature sensors 152a-c, the controller 150 adjusts power to lamps and/or lamp zones to conform the observed thermal data to the targeted temperature profile. The controller 150 may also adjust power to the lamps and/or lamp zones to conform the thermal treatment of one substrate to the thermal treatment of another substrate, in the event chamber performance drifts over time.

The processing chamber 100 may additionally include other components, such as a controller 162, a lamp driver 160, and a power source 164 to facilitate operation of the processing chamber 100. Alternatively, aspects of control, lamp driving, and power output may be handled by the temperature controller 150. In such an example, one or more of the controller 162, the lamp driver 160, and the power source 164 may be omitted.

FIG. 2 illustrates a view of lamphead 101 according to an embodiment. In this implementation, lamphead 101 comprises a number of lamps 172. Only one of the lamps 172 is shown for simplicity; however, there may be dozens or even hundreds of lamps in various embodiments. The lamps 172 are divided into zones, such as concentric rings of multiple lamps 172. Each lamp 172 belongs to a specific zone. For example, there may be a specific number of lamps in Zone 1, in the center of the lamphead 101. Zone 2 may have a different number of lamps than Zone 1 or the same number. As shown, Zones n−1, n, n+1, n+2, and n+3 may also have any suitable number of lamps in each of these respective zones. Zones 1, 2, n−1, n, n+1, n+2, and n+3 are generally known to represent a varying number of zones. Zone 2 is generally understood to be concentric with and encircling Zone 1. Zone n−1 is generally understood to be concentric with and encircling Zone 2. Zone n is generally understood to be concentric with and encircling Zone n−1. Zone n+1 is generally understood to be concentric with and encircling Zone n. Zone n+2 is generally understood to be concentric with and encircling Zone n+1. Zone n+3 is generally understood to be concentric with and encircling Zone n+1, such that zone n+3 forms an outermost zone (as shown), however, additional zones are contemplated. A specific zone may have, for example, 12, 24, 30, or 36 lamps in some example embodiments. Lamphead 101 may comprise any suitable number of lamp zones. The lamps of each lamp zone may be arranged in a single ring, where the lamps are only one lamp thick radially, or the lamps of each lamp zone may be arranged so that each lamp zone is multiple lamps thick radially. Zones 1, 2, n−1, n, n+1, n+2, and n+3 may each have the same width. In some embodiments, each of the zones has the same width except for the middle zone, Zone 1. Each of the zones may have the same width to accommodate the same quantity of lamp rings, although each lamp ring may include progressive more individual lamps than radially-inward lamp rings. In some embodiments, each of the zones includes one lamp ring. In yet other embodiments, each of the zones includes multiple lamp rings, such as two lamp rings, three lamp rings, or four lamp rings. The width of each of the zones can be quantified as a radial width (dr). The radial width (dr) of each zone may be the same. In one exemplary embodiment, the middle zone (zone 1) may have a diameter of two times the radial width (dr), such that the diameter of zone 1 is 2*(dr). In yet another embodiment, zone 1 may have a diameter equal to the radial width (dr), such that the diameter of zone 1 is dr.

In other exemplary embodiments, there may be more or less lamp zones than the 7 lamp zones described above. This can be accomplished by the creation of additional lamp zones, or the separation of previous lamp zones into fractional lamp zones. In some embodiments, there are 15 lamp zones.

The lamp zones are further collected into groups for control. For example, in this example embodiment lamp Zone 1 is a first group. The lamps 172 in Zone 2 comprise a second group. However, some zones are grouped together for control. Here, at least four different groups are shown as an example. The four groups are Group 1, Group 2, Group m, and Group m+1. Group 1 comprises Zone 1, Group 2 comprises Zone 2, Group m comprises Zone n−1 and Zone n, and Group m+1 comprises Zone n+1, Zone n+2, Zone n+3. Different numbers of lamp zones can be in each group. Generally, the number of lamp zones within a particular group increases as the lamp zones extend radially outward. Power to the lamps per group is positively or negatively adjusted (i.e., an offset value is introduced) to increase or decrease the temperature in the chamber, and this power is conventionally equally distributed to each lamp in the group. However, temperature controller 150 and/or controller 162, in embodiments described herein, allow for different power distribution to the zones within a group. In one example embodiment, a zone offset can be tuned or adjusted to distribute power within the lamps in the group. That is, if Zone n is in a Group m with Zone n−1, power can be distributed unequally within Group m by utilizing a zone offset to change the power distribution, so that the lamps in Zone n receive a different level of power than the lamps in Zone n−1. The power to the lamps in Zone n can therefore be controlled independently of the power to the lamps in other zones in Group m, which allows for greater control of the temperature distribution in the chamber, which in turn is used to improve process uniformity. Similarly, power to Zone n+1 can be controlled independently of other lamp zones in Group m+1 by changing a zone offset value of one of the zones within Group m+1, such as Zones n+2 and n+3. Any of the lamp zones can be controlled independently of any other lamp zone according to embodiments described herein. In zones located near the edge of the substrate 174, controlling these zones independently of other zones in their respective groups has been shown to provide the ability to improve process uniformity at the edge of the substrate 174. The adjustment of the power supplied to one zone in comparison to the other zones may be determined by a zone offset value. In some embodiments, the zone offset value is a correction factor that can be varied experimentally to obtain a change in voltage distribution to at least one lamp zone. In some embodiments, zones in different groups can utilize the same zone offset value, or the zone offset value can be applied to one zone, but not another. In one example, Zone n and Zone n+1 have different zone offset values applied and Zone n has a different change in voltage application than Zone n+1. In other embodiments, zone offset values can be distributed amongst any of the zones in any suitable distribution.

FIG. 2 further illustrates the location of a sample temperature probe 152. The location of probe 152 is illustrated as a dot in phantom on the figure, but the probe 152 is not in the same plane as the lamphead 101. The probe 152 is illustrated to show the relative location of a probe within the radius of the lamphead 101. The probe 152 may be illustrative of a plurality of probes. In one embodiment, which can be combined with other embodiments, one or more probes 152 can be found in every zone and/or every group. In some embodiments, seven probes 152 are used, but only one probe 152 is shown here for simplicity. Any suitable number of probes 152 may be used in other embodiments. In general, the probes 152 are located at different radial distances from the center of the substrate. This allows for temperatures to be monitored at different points across the surface of the substrate.

Embodiments described herein utilize the probes 152 (such as pyrometers) to measure the temperature of a substrate at different radial locations. Power to one or more lamp zones is adjusted using the zone offset values until a desired uniformity is reached. The adjusting can be performed by temperature controller 150 and/or controller 162 in some embodiments.

In some embodiments, there is one probe 152 for each group. In this embodiment, each group has a probe 152 defined within the diameter of the group. Each group is then further split into zones. The groups split into zones at least partially to split the load of lamp drivers utilized to control the power supplied to each zone. As there is only one probe 152 for each group, each zone may share a probe 152 with another zone. Another determination of how each group is split into zones includes the radial distance from the center of the lamphead 101. As stated above, the radial width is the width of each zone in the radial direction (e.g., the difference between the outer diameter and inner diameter). As each zone may have the same radial width, each group may therefore have a different radial width, as some groups may include more or less zones than other groups. By using multiple zones per probe 152, it is possible to achieve greater temperature uniformity and control across a substrate while reducing the temperature non-uniformities caused by the utilization of the probes 152. The reduction of the number of probes 152 per zone to where there is less than one probe per zone along the outer groups/zones makes the control of the outer zones increasingly difficult to predict, but enables greater control of the overall temperature throughout the diameter of the lamphead 101.

To improve process uniformity using lamp zone control and account for the increased difficulty in predicting the temperature along the diameter of the substrate, a mathematical model is used. The mathematical model predicts uniformity based on empirical process uniformity data and zone offset values for any desired lamp zones. In one embodiment, zone offset values for zones near an edge of the substrate are determined to improve process uniformity at the edge of the substrate.

Sensitivity curves are created for the zone offset values. A temperature sensitivity curve describes the behavior of the radial temperature distribution in a specific processing chamber when one or more parameters are changed. In other words, if a zone offset value is changed and power to a lamp zone increases or decreases by a specific percentage, the temperature sensitivity curve illustrates how that change in zone offset value affects the temperature deviation across a substrate.

While FIG. 2 illustrates one example of a lamphead 101, it is contemplated that other lampheads 101 may benefit from aspects of the disclosure. For example, other lampheads, having a different number of lamps, zones, or groups, may be utilized. Other lampheads may be shaped or structured differently than lamphead 101. As an example, a lamphead with linear shaped lamps in a parallel configuration utilizing an upper and lower lamphead may be used.

Figure 3:
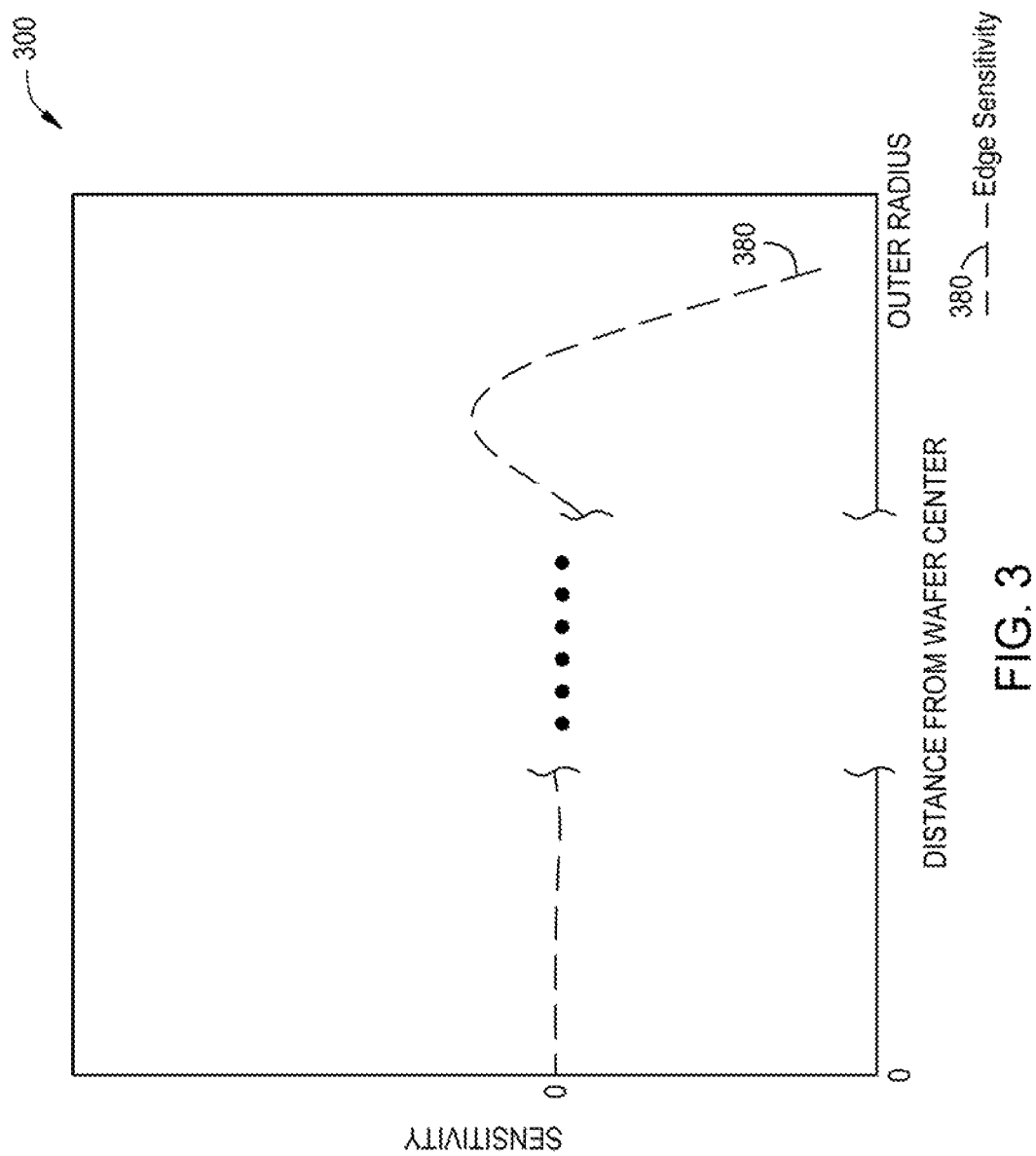
FIG. 3 is a graph of example temperature sensitivity curves according to an embodiment.

FIG. 3 illustrates a graph 300 of an example sensitivity curve for one or more offset values according to an embodiment. The y-axis shows the temperature deviation around 0. A curve above 0 indicates an expected increase in temperature, at a particular distance from the substrate center, caused by the offset value, while the curve below 0 indicates an expected decrease in temperature, at a particular distance from the substrate center, caused by the offset value. The x-axis denotes the radial distance from the center of the substrate. The left edge of graph 300 is at the center of the substrate, while the right edge is the radial position at the outside edge of the substrate. The temperature sensitivity curve illustrated is merely an example and may be a different curve in other embodiments. Sensitivity curves may be determined in one embodiment by using a simulation that utilizes the power distribution of the lamps in combination with heat conductance of the substrate material. In general, the more precise the sensitivity curve is, the more precise the simulation will be.

Graph 300 illustrates a temperature sensitivity curve 380 for a change in the lamp zone offset value for a certain zone or zones of +Y %. That is, the zone offset value of one or more zones is increased, and power to the lamps in the example zone or zones is subsequently increased by Y %. In this example, the one or more zones are located near the edge of the substrate, so curve 380 shows a large effect near the edge of the substrate but a much smaller effect as the curve moves toward the center of the substrate. Other lamp zones would show effects in other radial positions along the substrate, depending on the location of those lamp zones with respect to the center of the substrate. In addition, in other embodiments separate temperature sensitivity curves may be used for separate zones so that offsets for these lamp zones can be determined separately. In the example below, two zones, Zone n and Zone n+1, which are located in different groups, will receive a change in zone offset value.

The temperature sensitivity curve 380 illustrated in graph 300 exhibits a linear behavior. That is, if the offset parameter is changed by a factor of x, then the temperature distribution is changed by x*S(r), if S(r) is the sensitivity curve for any given parameter. For example, if the increase in power to the lamp was doubled from +Y % to +2Y %, the magnitude of curve 380 would also double. Other additional examples of controllable parameters include temperature offset values of each zone. In other embodiments, quadratic behavior and higher orders may be used as well, such as $x^2*S(r)$.

The effects illustrated in graph 300 are also additive if there are multiple sensitivity curves. That is, after offsets values are chosen and the curves are generated, the magnitudes of the sensitivity curves can be added together to predict a new temperature uniformity for the substrate. Because an offset value is chosen in this example for one or more specific zones near an edge of the substrate (i.e., Zones n and n+1), the uniformity at the extreme outer edge of the substrate can be modulated. A simulation process, described herein, is used to determine values of the offsets values based on one or more goals or criteria. The criteria may be minimizing the standard deviation of the temperature distribution. Other criteria may be reducing the sum of the slope of the points at the edge of the substrate. In addition, a combination of different criteria could be combined.

Simulation of the expected temperature distribution is performed in one embodiment using the equations herein. In the equations herein, T(r) is the radial temperature distribution as measured over the radius r, which goes from 0 (at the center of the substrate) to $Substrate_{diameter}/2$ (the radius of the substrate). This distribution can be measured by using a test substrate and performing a resistivity (RS) analysis, and then converting into a temperature distribution using an RS/temperature conversion factor. Alternatively, an oxide thickness test substrate analysis is performed and then converted into a temperature distribution using an oxide thickness/temperature conversion factor. Any other suitable method may be used to determine a radial temperature distribution T(r) for an appropriate number of points r along the radius.

SZ(r) is the sensitivity curve for a zone offset parameter, such as curve 380. In other embodiments, additional sensitivity curves for additional zones and zone offset values may be used in addition to, or in place of, the sensitivity curve 380. Because embodiments described herein allow for different offset values for zones in the same group, Zone n can be controlled independently of other zones in Group m, and Zone n+1 can be controlled independently of other zones in Group m+1.

dZ is the zone offset value that is simulated in the example shown in FIG. 3. During the simulation, the zone offset value is varied using any suitable mathematical technique to adjust the value until a predetermined value is reached. The expected temperature distribution, which is represented by curve R(r), is calculated as the following:

$$R(r)=T(r)+dZ*SZ(r)$$

During the simulation, for each value of the radius r, the zone offset value dZ is first set to an initial value and R(r) is calculated using the offset value dZ and the sensitivity curve SZ(r). Then, the zone offset value is adjusted and R(r) is calculated for the new zone offset value. Any suitable adjusting algorithm may be used to determine a target by repeatedly adjusting the offset value until a predetermined desired value of R(r) is reached. The adjusting process is performed by any suitable software program, and can be performed more than once. That is, after the predetermined value is reached, the process may be run again. Because optimization simulations and temperature sensitivity data are not exact, performing the simulation multiple times may lead to a better result. In some embodiments it is possible for the simulation to be performed in a repeating loop to optimize the offset value.

In one example, the operation may be performed to achieve the predetermined goal of minimizing the standard deviation of the temperature distribution R(r). Embodiments described herein used in a test case reduced a standard deviation of the temperature distribution across the substrate from 0.759 to 0.253. Another approach is to test the uniformity at the edge of the substrate (edge slope) to see how much variation in uniformity occurs at that location. Embodiments described herein may be used to reduce edge slope as well as improve uniformity throughout the rest of the substrate. In some embodiments there could be a tradeoff between good uniformity throughout the substrate and good results on the edge of the substrate. In those cases, a user could decide which of those results to adjust or optimize and by how much. In other cases, there may not be a tradeoff between uniformity throughout the substrate and edge slope and a user could determine offset values that lead to good results for both. In one embodiment, there is a combined optimization goal of minimizing the standard deviation of $R(r)$ multiplied by the edge slope, wherein the edge slope is the absolute sum of the slope at all points at a substrate radius greater than a predetermined substrate radius. In some embodiments, the edge slope is the absolute sum of the temperature readings slope of all points at a substrate radius greater than 130 millimeters excluding the 3 millimeters at the edge of the substrate.

In some embodiments the calculation for the expected temperature distribution $R(r)$ is calculated using additional sensitivity curves and offset values for separate parameters. The additional parameters may include temperature or zone offset parameters of each zone. In some embodiments, which may be combined with other embodiments, it is possible to utilize the sensitivity curves and temperature or zone offset values that correspond to all of the offset parameters for each zone as well as the sensitivity curve and offset value for the zone offset ($SZ(r)$ and $dZ$). This can be done by adding each multiple of the temperature offset sensitivity curves and the temperature offset values to the equation for $R(r)$ linearly.

Figure 4:
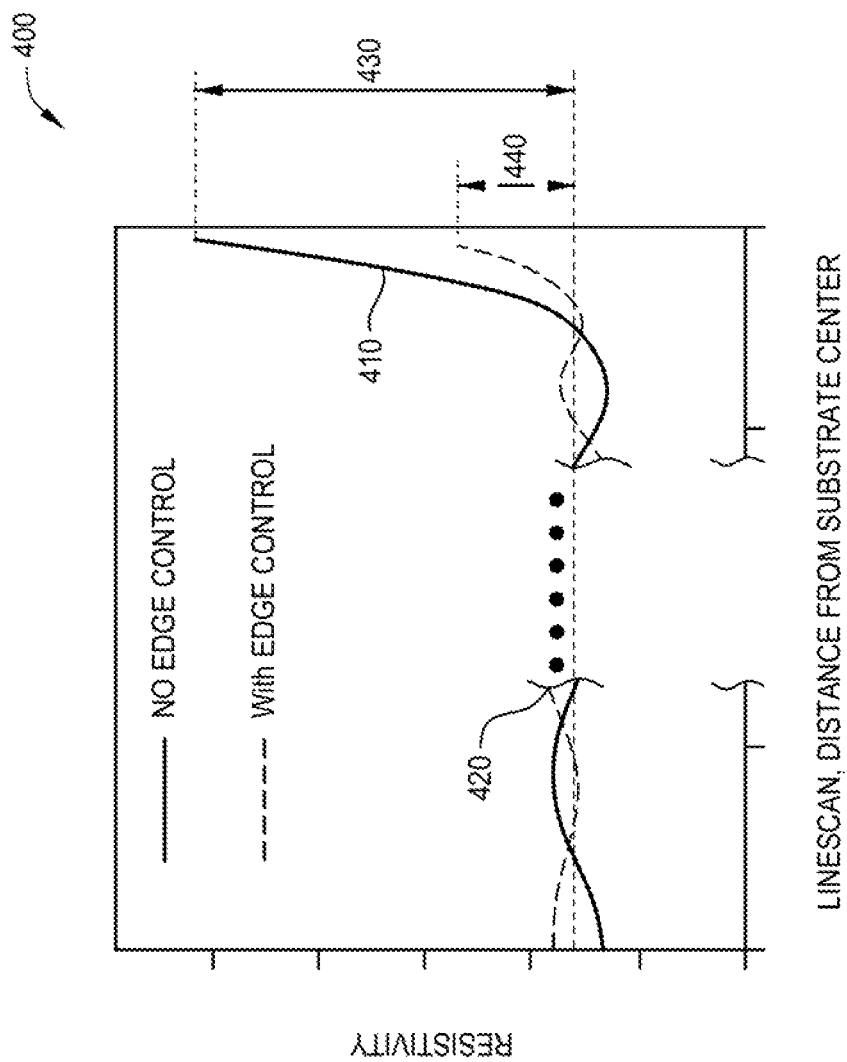
FIG. 4 is a graph illustrating uniformity for two chamber processes according to an embodiment.

FIG. 4 illustrates a graph 400 that illustrates uniformity for chamber processes in one example embodiment. The y-axis denotes resistivity of a layer on the substrate after the chamber processes and the x-axis denotes a radial distance from the center of the substrate. Curve 410 illustrates a process performed without edge control. Curve 410 therefore shows a large increase 430 in measured resistivity at the far right edge of the graph. When edge control is used via lamp zone control according to embodiments described herein, however, curve 420 illustrates a much smaller increase 440 in measured resistivity at the far right edge of the graph and the outermost position point of the substrate. Graph 400 illustrates one example of how embodiments described herein can produce better temperature control at the edge of a substrate. Improved temperature control can also be attained at other locations along the substrate using the techniques described herein.

Simulation goals could also be defined by users and may vary for different users and for different applications. A user can choose any suitable predetermined goal as a target or targets and then run one or more simulations until a desired goal is reached. An exemplary simulation goal is a combination of temperature uniformity of the substrate and a temperature at an edge of the substrate.

Figure 5:
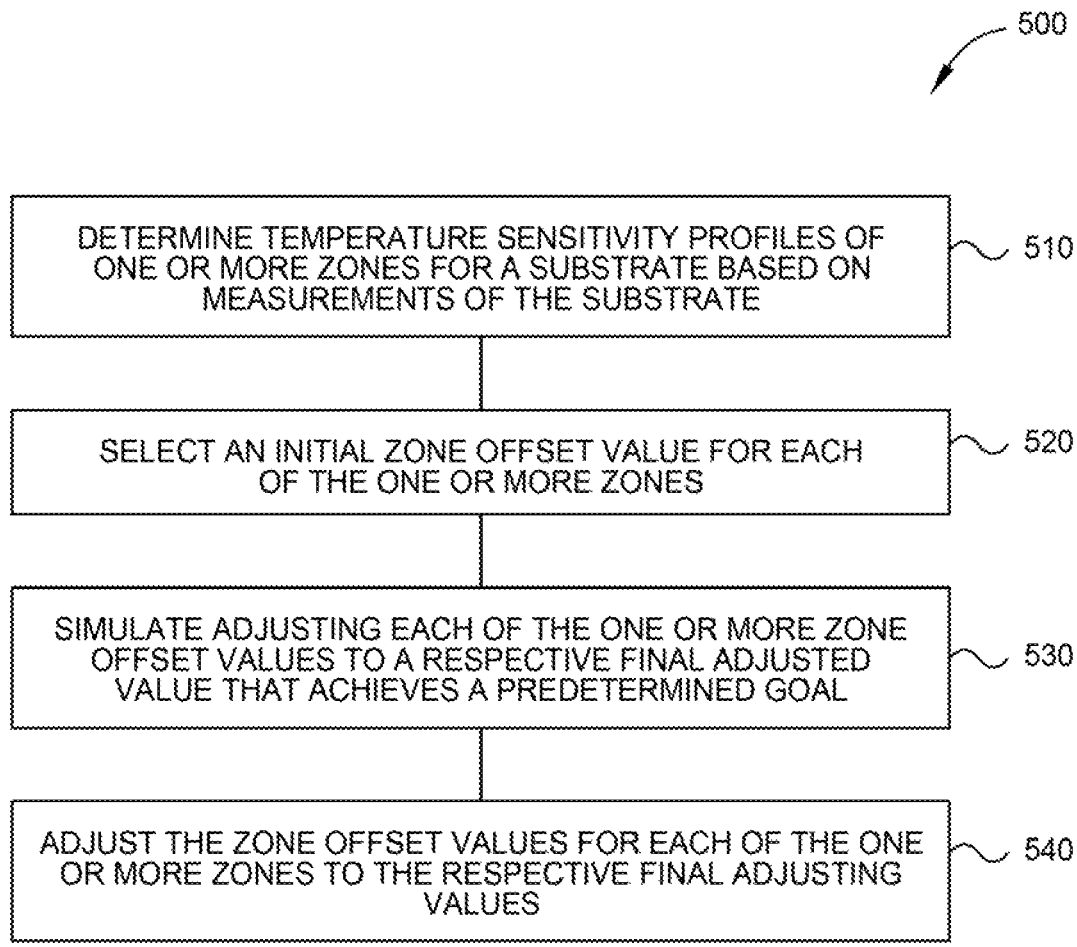
FIG. 5 is a flowchart illustrating a method for controlling temperature in a thermal processing chamber according to an embodiment.

FIG. 5 is a flow diagram that illustrates a method 500 for process uniformity adjusting according to one embodiment. Although the method operations are described in conjunction with FIGS. 1-4, any system configured to perform the method operations, in any suitable order, falls within the scope of the present disclosure.

The method 500 may be executed by a computer system for controlling temperature in a thermal processing chamber. The computer system may include a processor and memory storage. The processor may execute a program within the memory storage. Executing the program may include executing the method 500.

Method 500 begins at operation 510, where a user or designer of a chamber processing system determines temperature sensitivity profiles of one or more heating elements for a substrate based on measurements of the substrate. An example of a temperature sensitivity profiles is illustrated in FIG. 3. The heating elements may comprise a lamp, a lamp zone, or a group of lamp zones as described above. The temperature sensitivity profile illustrates the change in temperature across a radial substrate position when an offset is introduced to a heating element. The sensitivity profiles may be determined using resistivity measurements across the diameter or radius of the substrate after a temperature or zone offset value is changed.

Once temperature sensitivity profiles are determined, the method proceeds to operation 520 where a user or simulation program selects a temperature and/or a zone offset value for each of the one or more heating elements or zones. The initial temperature and zone offset values operate as an initial seed value that will be used to allow the simulator to begin the determination process.

The method proceeds to operation 530 where the simulator begins simulating adjustments to the temperature or zone offset values. In this operation, the simulator simulates adjustments to each of the one or more temperature and zone offset values in order to determine final temperature or zone offset values that achieve a predetermined goal. This predetermined goal can be reducing the standard deviation of the temperature distribution across the substrate, reducing the edge slope, or a combination of reducing the standard deviation of the temperature distribution across the substrate and reducing the edge slope. Any suitable simulator may be used to perform this operation. For example, the Solver Add-in for Microsoft® Office Excel may be used to perform this simulation.

The method proceeds to operation 540, where a user or a component of the chamber processing system adjusts the temperature and zone offset values for each of the one or more heating elements or zones to the final temperature or zone offset adjusted values. The temperature and zone offset values for the heating elements may be adjusted by controller 150 in one embodiment. Once the final adjusted values are reached and the simulator has achieved the predetermined goal, the chamber can be used with improved process results.

In an exemplary embodiment, a plurality of lamps or heating elements is utilized to process a substrate in a processing chamber. The plurality of lamps or heating elements are grouped into a plurality of concentric groups. The groups are defined by temperature control architecture. The temperature control architecture can be the radial distribution of lamps, the control capabilities of lamp controllers utilized, the distribution of pyrometers/temperature probes, and lamp power drives. The plurality of groups includes one or more concentric zones. Each of the groups has one or more zones. The groups are split into zones based off of the capabilities of the temperature control architecture and desired temperature control resolution. Currently, there are no previously well established methods for determining a preferred quantity of power delivered to each individual zone within a group. Previous methods have involved systematic guessing and checking, which has proved time consuming, expensive, and in many cases, yields little to none noticeable results. The present embodiment of the disclosure uses zone sensitivity curves, which are determined empirically. The zone sensitivity curves display a projected change in temperature across the diameter or radius of a substrate based upon a change in power supplied to one individual zone. This change in power supplied to one individual zone is described above as the zone offset value. The zone offset value is a number which represents the change in power from a base line power supply and supplied to a zone. By utilizing a plurality of zone sensitivity curves (as previously described) within a simulation, it is possible to estimate zone offset values that would subsequently change the power supplied to each zone within a group, and therefore the temperature uniformity across a substrate. Once the zone offset values are simulated by a computer algorithm, the zone offset values within the device are changed to match optimized zone offset values from the simulation. Optimal results for temperature uniformity are programmed into the algorithm to obtain different uniformity results for different applications. The zone offset values within the device determine the power distribution to each zone of the plurality of zones.

The embodiments described herein also relate to an apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, read-only memories (ROMs), random access memories (RAMs), EPROMs, EEPROMs, flash memory, magnetic or optical cards, any type of disk including floppy disks, optical disks, CD-ROMs, and magnetic-optical disks, or any type of media suitable for storing electronic instructions, and each coupled to a computer system interconnect.

The algorithms and displays presented herein are not inherently related to any particular computer or other apparatus. Various general purpose systems may be used with programs in accordance with the teachings herein, or teachings herein may prove convenient to construct a more specialized apparatus to perform the disclosed method operations. The structure for a variety of these systems will appear from the description above. In addition, the present examples are not described with reference to any particular programming language, and various examples may thus be implemented using a variety of programming languages.

While the foregoing is directed to embodiments described herein, other and further embodiments may be devised without departing from the basic scope thereof. For example, aspects of the present disclosure may be implemented in hardware or software or in a combination of hardware and software. One embodiment described herein may be implemented as a program product for use with a computer system. The program(s) of the program product define functions of the embodiments (including the methods described herein) and can be contained on a variety of computer-readable storage media. Illustrative computer-readable storage media include, but are not limited to: (i) non-writable storage media (for example, read-only memory devices within a computer such as CD-ROM disks readable by a CD-ROM drive, flash memory, ROM chips or any type of solid-state non-volatile semiconductor memory) on which information is permanently stored; and (ii) writable storage media (for example, floppy disks within a diskette drive or hard-disk drive or any type of solid-state random-access semiconductor memory) on which alterable information is stored. Such computer-readable storage media, when carrying computer-readable instructions that direct the functions of the disclosed embodiments, are embodiments of the present disclosure.

While the foregoing is directed to embodiments of the present disclosure, other and further embodiments of the disclosure may be devised without departing from the basic scope thereof, and the scope thereof is determined by the claims that follow.

What is claimed is:

1. A method for controlling temperature in a thermal processing chamber, the thermal processing chamber comprising a plurality of heating elements divided into a plurality of concentric zones, each concentric zone of the plurality of concentric zones is part of a group of a plurality of groups, each group of the plurality of groups corresponding to one temperature probe, at least one group of the plurality of groups comprising a first concentric zone and a second concentric zone, the method comprising:
   determining temperature sensitivity profiles of one or more of the plurality of concentric zones for a substrate based on measurements of the substrate, wherein a temperature sensitivity profile of the temperature sensitivity profiles illustrates a projected change in temperature across a diameter or a radius of a substrate based on a zone offset value, the zone offset value representing a change in power from a base line power supplied to an individual concentric zone of the plurality of concentric zones;
   selecting one or more initial zone offset values for each of the one or more of the plurality of concentric zones;
   simulating an adjustment of each of the one or more initial zone offset values to a respective final adjusting zone offset value that achieves a predetermined goal; and
   adjusting zone offset values for each of the one or more of the plurality of concentric zones to the respective final adjusting zone offset value, such that a power distribution and a temperature distribution to the one or more of the plurality of concentric zones is changed, wherein changing the power distribution comprises delivering a different level of power to the heating elements in the first concentric zone than the heating elements in the second concentric zone.

2. The method of claim 1, wherein the predetermined goal further comprises a temperature uniformity of the substrate.

3. The method of claim 2, wherein the predetermined goal further comprises minimizing a standard deviation of a temperature distribution, wherein the temperature distribution comprises a sum of each zone offset value multiplied by the zone offset value's respective temperature sensitivity profile.

4. The method of claim 3, wherein the predetermined goal further comprises minimizing the standard deviation of the temperature distribution multiplied by a slope of temperature readings at an edge of the substrate.

5. The method of claim 1, wherein the one or more of the plurality of concentric zones are located at or near an edge of the substrate.

6. The method of claim 1, wherein adjusting each of the one or more initial zone offset values comprises simulating a temperature distribution while varying one or more of the initial zone offset values until the predetermined goal is achieved.

7. The method of claim 1, wherein each of the heating elements is a lamp.

8. A computer system for controlling temperature in a thermal processing chamber, the thermal processing chamber comprising a plurality of heating elements divided into a plurality of concentric zones, each concentric zone of the plurality of concentric zones is part of a group of a plurality of groups, each group of the plurality of groups corresponding to one temperature probe, at least one group of the plurality of groups comprising a first concentric zone and a second concentric zone, the computer system, comprising:
 a processor; and
 a memory storing instructions that, when executed by the processor, cause the computer system to:
  determine temperature sensitivity profiles of one or more zone offset values for a substrate based on measurements of the substrate, wherein a temperature sensitivity profile of the temperature sensitivity profiles illustrates a projected change in temperature across a diameter or a radius of a substrate based on a zone offset value, the zone offset value representing a change in power from a base line power supplied to an individual concentric zone of the plurality of concentric zones;
  select one or more initial zone offset values for each of one or more of the plurality of concentric zones;
  simulate an adjustment of each of the one or more initial zone offset values to a respective final zone offset adjusting value that achieves a predetermined goal; and
  adjust zone offset values for each of the one or more of the plurality of concentric zones to the respective final adjusted zone offset value, such that a power distribution to the one or more of the plurality of concentric zones is changed, wherein changing the power distribution comprises delivering a different level of power to the heating elements in the first concentric zone than the heating elements in the second concentric zone.

9. The computer system of claim 8, wherein the predetermined goal further comprises a temperature uniformity of the substrate.

10. The computer system of claim 9, wherein the predetermined goal further comprises minimizing a standard deviation of a temperature distribution, wherein the temperature distribution comprises a sum of each zone offset value multiplied by the zone offset value's respective temperature sensitivity profile.

11. The computer system of claim 10, wherein the predetermined goal further comprises minimizing the standard deviation of the temperature distribution multiplied by a slope of temperature readings at an edge of the substrate.

12. The computer system of claim 8, wherein the one or more of the plurality of concentric zones are located at or near an edge of the substrate.

13. The computer system of claim 8, wherein adjusting each of the one or more initial zone offset values comprises simulating a temperature distribution while varying one or more of the initial zone offset values until the predetermined goal is achieved.

14. A non-transitory computer-readable medium that causes a computer system to control temperature in a thermal processing chamber, the thermal processing chamber comprising a plurality of heating elements divided into a plurality of concentric zones, each concentric zone of the plurality of concentric zones is part of a group of a plurality of groups, each group of the plurality of groups corresponding to one temperature probe, at least one group of the plurality of groups comprising a first concentric zone and a second concentric zone, by performing the operations of:
 determining temperature sensitivity profiles of one or more of the plurality of concentric zones for a substrate based on measurements of the substrate, wherein a temperature sensitivity profile of the temperature sensitivity profiles illustrates a projected change in temperature across a diameter or a radius of a substrate based on a zone offset value, the zone offset value representing a change in power from a base line power supplied to an individual concentric zone of the plurality of concentric zones;
 selecting one or more initial zone offset values for each of the one or more of the plurality of concentric zones;
 simulating an adjustment of each of the one or more initial zone offset values to a respective final adjusting zone offset value that achieves a predetermined goal; and
 adjusting zone offset values on a device for each of the one or more of the plurality of concentric zones to the respective final adjusting zone offset value, such that a power distribution to the one or more of the plurality of concentric zones is changed, wherein changing the power distribution comprises delivering a different level of power to the heating elements in the first concentric zone than the heating elements in the second concentric zone.

15. The non-transitory computer-readable medium of claim 14, wherein the predetermined goal further comprises a temperature uniformity of the substrate.

16. The non-transitory computer-readable medium of claim 15, wherein the predetermined goal further comprises minimizing a standard deviation of a temperature distribution, wherein the temperature distribution comprises a sum of each zone offset value multiplied by the zone offset value's respective temperature sensitivity profile.

17. The non-transitory computer-readable medium of claim 16, wherein the predetermined goal further comprises minimizing the standard deviation of the temperature distribution multiplied by a slope of temperature readings at an edge of the substrate.

18. The non-transitory computer-readable medium of claim 14, wherein the one or more of the plurality of concentric zones are located at or near an edge of the substrate.

19. The non-transitory computer-readable medium of claim 14, wherein adjusting each of the one or more initial zone offset values comprises simulating a temperature distribution while varying one or more of the initial zone offset values until the predetermined goal is achieved.

* * * * *